(12) United States Patent
Bartley et al.

(10) Patent No.: US 7,723,816 B2
(45) Date of Patent: May 25, 2010

(54) IMPLEMENTING DECOUPLING CAPACITORS WITH HOT-SPOT THERMAL REDUCTION ON INTEGRATED CIRCUIT CHIPS

(75) Inventors: Gerald Keith Bartley, Rochester, MN (US); Todd Alan Christensen, Rochester, MN (US); Paul Eric Dahlen, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 12/186,837

(22) Filed: Aug. 6, 2008

(65) Prior Publication Data
US 2010/0032799 A1 Feb. 11, 2010

(51) Int. Cl.
*H01L 27/01* (2006.01)
*H01L 31/058* (2006.01)
(52) U.S. Cl. .................. 257/467; 257/347; 257/532; 257/E29.347
(58) Field of Classification Search ................. 257/347, 257/467, 532, E29.347
See application file for complete search history.

(56) References Cited
U.S. PATENT DOCUMENTS

| | | | | |
|---|---|---|---|---|
| 6,800,933 | B1 * | 10/2004 | Mathews et al. | 257/712 |
| 7,157,372 | B1 * | 1/2007 | Trezza | 438/675 |
| 2006/0278995 | A1 * | 12/2006 | Trezza | 257/777 |
| 2006/0286775 | A1 * | 12/2006 | Singh et al. | 438/478 |
| 2007/0007595 | A1 * | 1/2007 | Hirano et al. | 257/347 |
| 2009/0085217 | A1 * | 4/2009 | Knickerbocker et al. | 257/774 |

OTHER PUBLICATIONS

U.S. Appl. No. 12/178,029 filed Jul. 23, 2008, by Gerald Keith Bartley et al. and entitled Implementing Reduced Hot-Spot Thermal Effects for SOI Circuits.

\* cited by examiner

*Primary Examiner*—Ngan Ngo
(74) *Attorney, Agent, or Firm*—Joan Pennington

(57) ABSTRACT

A method and structures are provided for implementing decoupling capacitors with hot spot thermal reduction on integrated circuit chips including silicon-on-insulator (SOI) circuits. A silicon-on-insulator (SOI) structure includes a silicon substrate layer, a thin buried oxide (BOX) layer carried by the silicon substrate layer, and an active layer carried by the thin BOX layer. A thermal conductive path is built proximate to a hotspot area in the active layer to reduce thermal effects including a backside thermal connection from a backside of the SOI structure. The backside thermal connection includes a backside etched opening extending from the backside of the SOI structure into the silicon substrate layer, a capacitor dielectric formed on said backside etched opening; and a thermal connection material deposited on said capacitor dielectric filling said backside etched opening.

12 Claims, 5 Drawing Sheets

IMPLEMENTING DECOUPLING CAPACITORS WITH HOT-SPOT THERMAL REDUCTION ON INTEGRATED CIRCUIT CHIPS

FIELD OF THE INVENTION

The present invention relates generally to the field of manufacturing semiconductor devices, and more particularly, relates to a method and structures for implementing decoupling capacitors with hot spot thermal reduction on integrated circuit chips including silicon-on-insulator (SOI) circuits.

DESCRIPTION OF THE RELATED ART

Silicon-on-insulator (SOI) transistors provide better performance at low operating voltages than do transistors of similar dimensions fabricated in bulk silicon substrates. Superior performance of SOI transistors at low operating voltage is related to the relatively lower junction capacitances obtained on an SOI device as compared to a bulk silicon device of similar dimensions. A buried oxide (BOX) layer in an SOI device separates active transistor regions from the bulk silicon substrate, reducing junction capacitance.

Typical semiconductor applications today have reached the point where the ability to keep the device junction temperatures under the limitations established for reliability and/or function and performance requirements are severely limited. These issues are exasperated by the fact that the power dissipation for chips such as processors, controllers, and the like, are not uniformly dissipated across the surface of the silicon.

Areas where performance matters most are also usually the same areas with the highest power density. Higher power density leads to higher temperatures. For example, there can be a 10-15 degree-C., or perhaps higher, temperature difference between the average and the peak temperature across a chip.

The higher temperature regions are often referred to as hot spots. The hot-spot temperatures lead to higher local leakage currents, which can further aggravate the situation. To control reliability issues, leakage, and to maintain the timing and performance expectations for a specific series of logic gates, the junction temperature is usually specified in a form such as an average temperature, and a peak temperature or not to exceed temperature.

This difference in temperature causes the same circuit in a cooler operating area to have a different performance and reliability than that of a hot-spot area.

U.S. patent application Ser. No. 12/178,029, filed Jul. 23, 2008 by the present inventors and assigned to the present assignee discloses methods and structures for implementing reduced hot spot thermal effects for silicon-on-insulator (SOI) circuits. A silicon-on-insulator (SOI) structure includes a silicon substrate layer, a thin buried oxide (BOX) layer carried by the silicon substrate layer, an active layer carried by the thin BOX layer, and a pad oxide layer carried by the active layer. A thermal conductive path is built to reduce thermal effects of a hotspot area in the active layer and extends from the active layer to the backside of the SOI structure. A trench etched from the topside to the active layer, and is filled with a thermal connection material. A thermal connection from a backside of the SOI structure includes an opening etched into the silicon substrate layer from the backside and filled with a thermal connection material.

High frequency chips also often have problems from switching noise that can cause fluctuations in the transient behavior of the power supply nodes. The voltage that a chip can operate for a given speed is limited by how much noise there is on the power supply distribution. If there is too much noise then the chip must run at a higher voltage to maintain a given frequency due to the fact that during a given noise event, the local voltage could be lower due to the noise.

Typically decoupling capacitors are added internally and externally to the chip to reduce the level of the noise fluctuations allowing the chip to run at a lower voltage thus saving power. However, the decoupling capacitors that are internal to the chip take up much area thus increasing the cost of the chip. The decoupling capacitors external to the chip take area on the module or board, cost extra money and are located a far distance from where the decoupling is needed.

A need exists for an effective mechanism for implementing decoupling capacitors with hot spot thermal reduction on integrated circuit chips including silicon-on-insulator (SOI) circuits.

SUMMARY OF THE INVENTION

Principal aspects of the present invention are to provide a method and structures for implementing decoupling capacitors with hot spot thermal reduction on integrated circuit chips including silicon-on-insulator (SOI) circuits. Other important aspects of the present invention are to provide such method and structures for implementing decoupling capacitors substantially without negative effect and that overcome many of the disadvantages of prior art arrangements.

In brief, a method and structures are provided for implementing decoupling capacitors with hot spot thermal reduction on integrated circuit chips including silicon-on-insulator (SOI) circuits. A silicon-on-insulator (SOI) structure includes a silicon substrate layer, a thin buried oxide (BOX) layer carried by the silicon substrate layer, and an active layer carried by the thin BOX layer. A thermal conductive path is built proximate to a hotspot area in the active layer to reduce thermal effects including a backside thermal connection from a backside of the SOI structure. The backside thermal connection includes a backside etched opening extending from the backside of the SOI structure into the silicon substrate layer, a capacitor dielectric formed on said backside etched opening; and a thermal connection material deposited on said capacitor dielectric filling said backside etched opening.

In accordance with features of the invention, a selected capacitor dielectric material is grown or deposited covering sidewalls of the backside etched opening to form the capacitor dielectric. Methods of deposition of the capacitor dielectric and also the thermal connection material include molecular beam epitaxy, chemical vapor deposition, atomic layer deposition, physical vapor deposition, and electrochemical vapor deposition. The capacitor dielectric is a silicon dioxide or alternatively a selected one of a silicon nitride, a hafnium oxide, a nitrided hafnium, an oxynitride, a silicate, a polyimide, or other organic dielectric. The thermal connection material is a thermally and electrically conductive material, such as tungsten, or alternatively a selected one of aluminum, copper, titanium and nickel.

In accordance with features of the invention, the thermal connection from the backside of the SOI structure is provided with each power supply rail including ground potential and each positive voltage rail for the SOI circuit.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a decoupling capacitor is created along the sidewalls of the electrically and thermally conductive path that is created from the backside of an integrated circuit chip or wafer for thermal hotspot reduction. A silicon dioxide is grown or deposited covering sidewalls of the backside etched opening to form the capacitor dielectric. The decoupling capacitor has the advantage of being formed close to the circuits in which decoupling capacitance is needed.

Figure 1A:
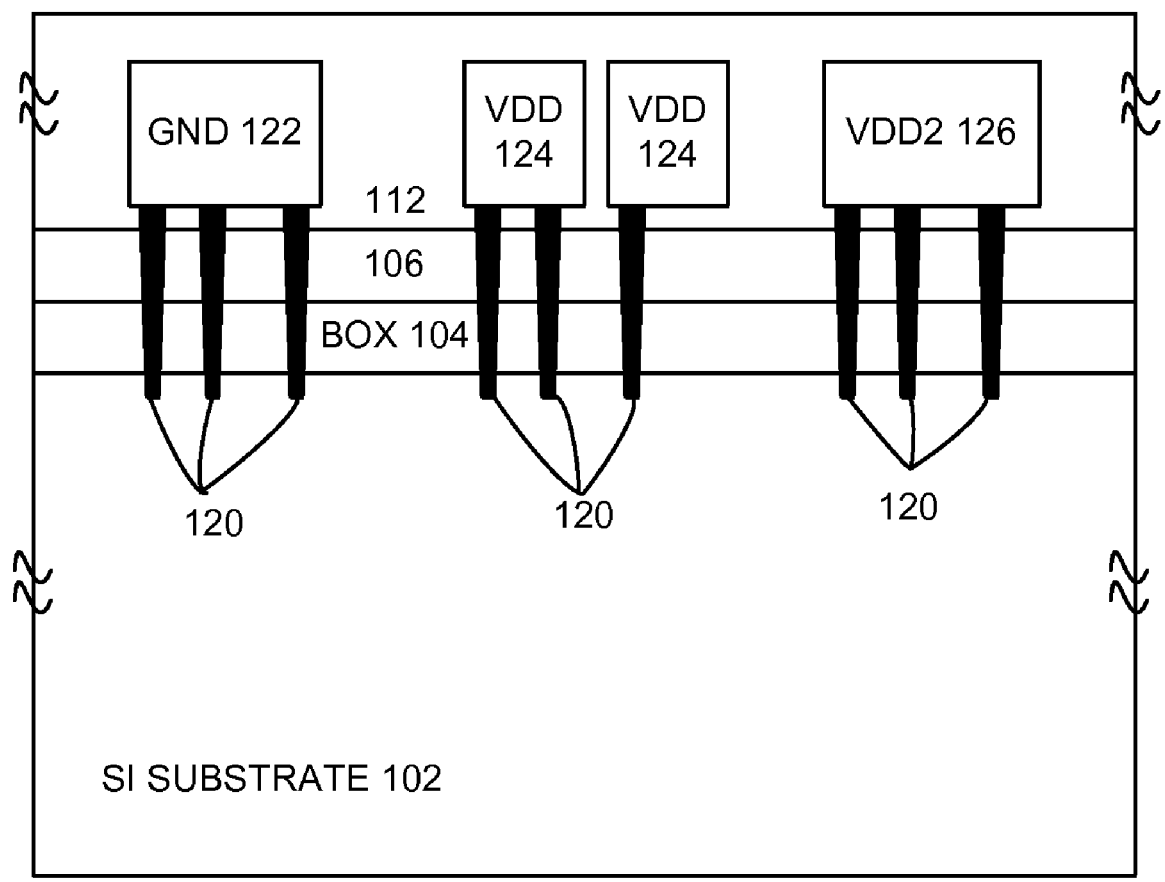
FIGS. 1A, 1B, 1C, 1D, and 1E are respective schematic side plan views not to scale illustrating exemplary process steps for fabricating decoupling capacitors with hotspot reduction structures in accordance with a preferred embodiment of the invention.

In FIG. 1A, an example silicon-on-insulator (SOI) structure 100 for implementing hotspot reduction structures in accordance with another preferred embodiment of the invention. SOI structure 100 includes a silicon substrate layer 102, a thin buried oxide (BOX) layer 104 carried by the silicon substrate layer 102, an active layer or silicon layer 106 carried by the thin BOX layer 104, and a pad oxide 112 carried by the active layer 106. Topside processing of the SOI structure 100 includes forming an etched and filled trench 120 through the pad oxide layer 112, the active layer 106, the BOX layer 104 to the silicon substrate layer 102. The etched and filled trench 120 is filled with a thermal connection material that is thermally and electrically conductive. A respective wire level layer or conductor is provided for power supply rails including ground 122, a first voltage rail VDD 124, and a second voltage rail VDD 126. Conventional SOI processing is performed to provide the illustrated SOI structure 100 of FIG. 1A.

Figure 1B:
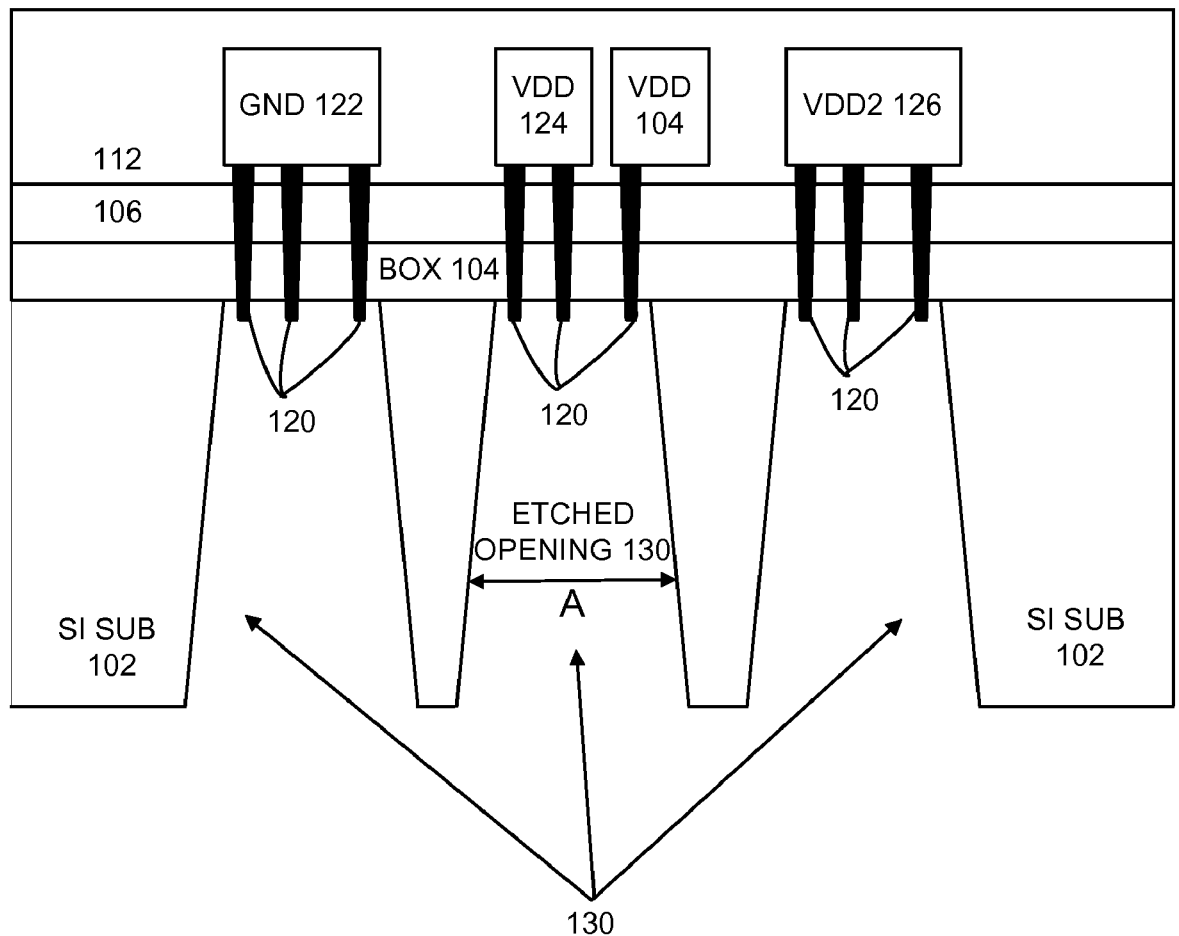

In FIG. 1B, a backside processing step is shown in the SOI structure 100 to form a thermal connection from a backside of the SOI structure. Backside processing of the SOI structure 100 includes pattern and etching a plurality of trenches 130 into the silicon substrate layer 102 and stopping on a boundary of the BOX layer 104. Each of the etched trenches or backside etched openings 130 has a selected width indicated by an arrow A to provide a thermal hotspot reduction connection to multiple devices formed in the active layer 106.

Figure 1C:
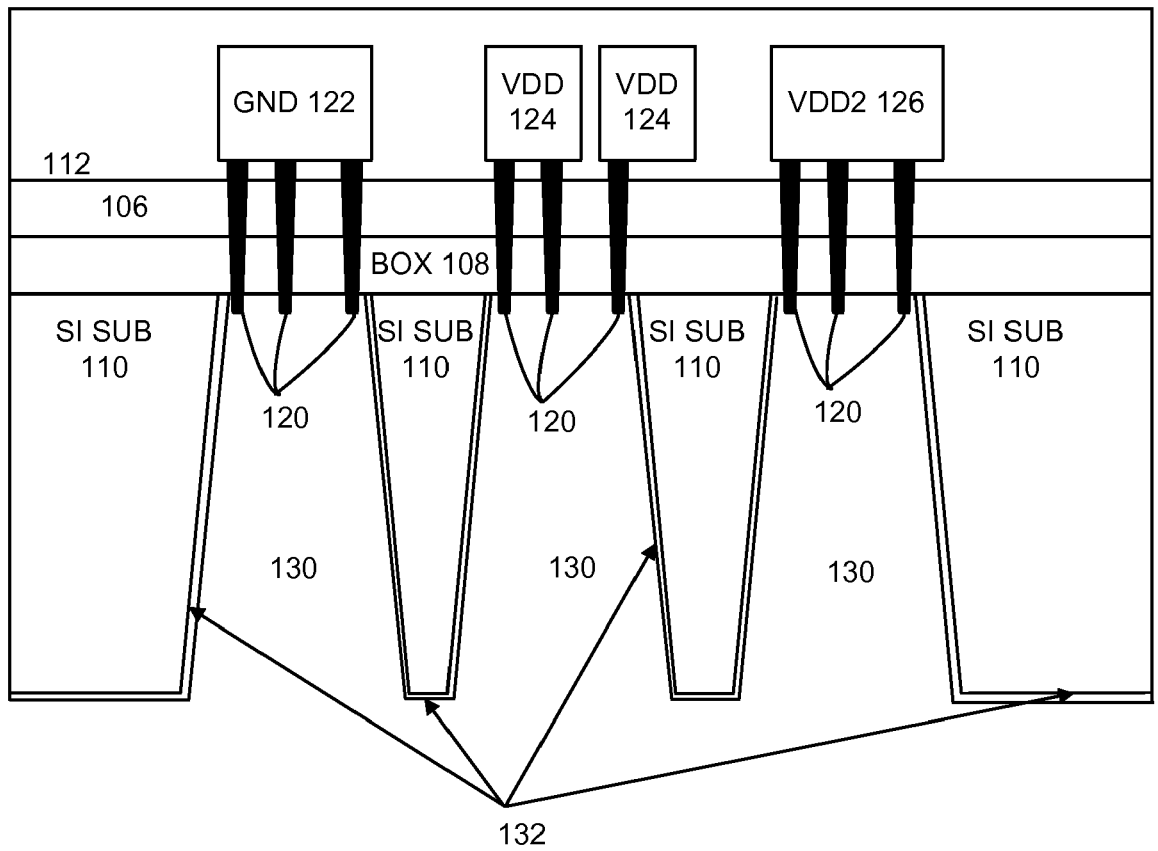

In FIG. 1C, a backside processing step is shown in the SOI structure 100 to form a capacitor dielectric 132 with the plurality of trenches 130 that are formed in FIG. 1B to provide for a thermal connection path. A selected one of a silicon dioxide $SiO_2$, a silicon nitride, a hafnium oxide, a nitrided hafnium, an oxynitride, a silicate, a polyimide or other organic dielectric is grown or deposited on the bulk silicon substrate layer 102 covering the sidewalls of the plurality of trenches 130 forming the capacitor dielectric 132.

Figure 1D:
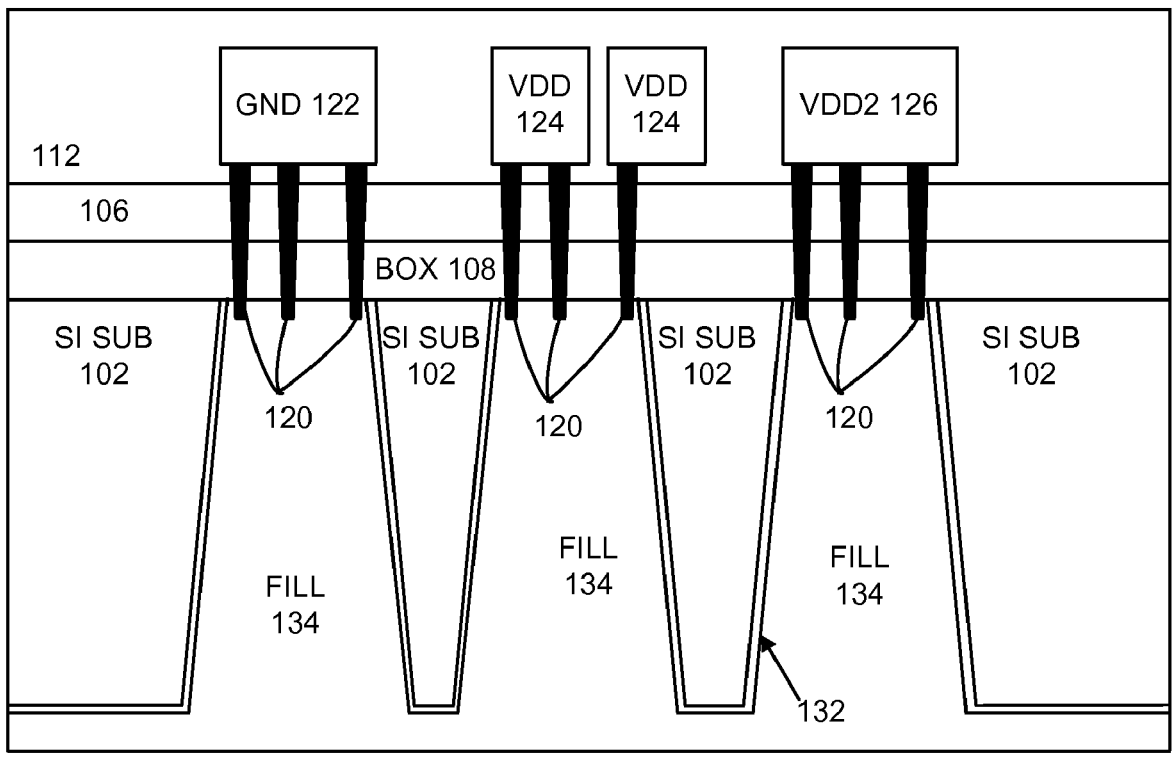

In FIG. 1D, a backside processing step is shown in the SOI structure 100 with the backside etched trenches 130 filled with a thermal connection and electrically conductive material 134. The thermal connection and electrically conductive material 134 is deposited onto the capacitor dielectric 132 filling the etched openings or trenches 130.

The thermal connection material fill 134 is a thermally and electrically conductive material, such as tungsten. Alternatively the thermal connection and electrically conductive material 134 includes a selected one of aluminum, copper, titanium and nickel.

Methods of deposition of the capacitor dielectric 132 and also the thermal connection material fill 134 include molecular beam epitaxy, chemical vapor deposition, atomic layer deposition, physical vapor deposition, and electrochemical vapor deposition.

Figure 1E:
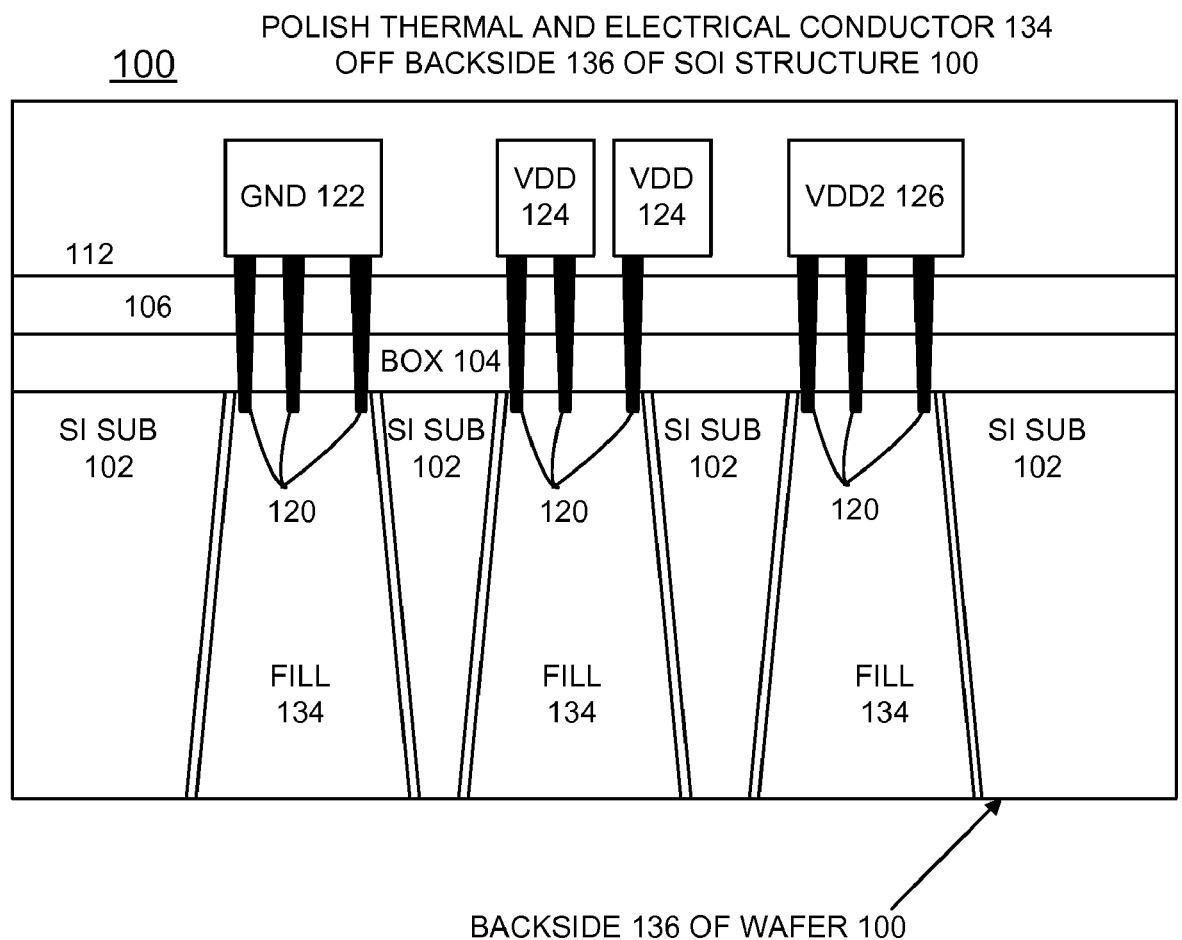

In FIG. 1E, a final backside processing step is shown in the SOI structure 100 with polishing the thermal connection and electrically conductive material 134 off a backside 136 of the wafer forming SOI structure 100.

While the present invention has been described with reference to the details of the embodiments of the invention shown in the drawing, these details are not intended to limit the scope of the invention as claimed in the appended claims.

What is claimed is:

1. A structure for implementing decoupling capacitors with hot spot thermal reduction on integrated circuit chips including silicon-on-insulator (SOI) circuits comprising:

a silicon-on-insulator (SOI) structure, said SOI structure including a silicon substrate layer, a thin buried oxide (BOX) layer carried by the silicon substrate layer, and an active layer carried by the thin BOX layer; a thermal conductive path proximate to a hotspot area in the active layer to reduce thermal effects including a backside thermal connection from a backside of the SOI structure;

said backside thermal connection including a backside etched opening extending from the backside of the SOI structure into the silicon substrate layer, a capacitor dielectric formed on said backside etched opening; and a thermal connection material deposited on said capacitor dielectric filling said backside etched opening.

2. The structure for implementing decoupling capacitors with hot spot thermal reduction as recited in claim 1 wherein said capacitor dielectric includes a silicon dioxide deposited on the silicon substrate layer covering sidewalls of said backside etched opening.

3. The structure for implementing decoupling capacitors with hot spot thermal reduction as recited in claim 1 wherein said capacitor dielectric includes a selected one of a silicon nitride, a hafnium oxide, a nitride hafnium, an oxynitride, a silicate, and a polyimide.

4. The structure for implementing decoupling capacitors with hot spot thermal reduction as recited in claim 1 includes a plurality of said backside etched openings are etched stopping on a boundary of the BOX layer.

5. The structure for implementing decoupling capacitors with hot spot thermal reduction as recited in claim 4 wherein said capacitor dielectric is formed on each of said plurality of said backside etched openings to form a decoupling capacitor array.

6. The structure for implementing decoupling capacitors with hot spot thermal reduction as recited in claim 1 wherein said thermal conductive path includes a topside etched trench extending from a topside of the SOI structure through the active layer and the BOX layer to the silicon substrate layer, said etched trench being filled with said thermal connection material.

7. The structure for implementing decoupling capacitors with hot spot thermal reduction as recited in claim 6 wherein said thermal connection material is thermally and electrically conductive.

8. The structure for implementing decoupling capacitors with hot spot thermal reduction as recited in claim 6 wherein said topside etched trench is connected to a wire level layer.

9. The structure for implementing decoupling capacitors with hot spot thermal reduction as recited in claim 6 wherein said wire level layer is provided for a power supply rail.

10. The structure for implementing decoupling capacitors with hot spot thermal reduction as recited in claim 6 wherein said thermal conductive path includes a plurality of said topside etched trenches provided with a plurality of power supply rails including ground potential and at least one positive voltage rail for the SOI circuit.

11. The structure for implementing decoupling capacitors with hot spot thermal reduction as recited in claim 1 wherein said capacitor dielectric is deposited on the silicon substrate layer covering sidewalls of said backside etched opening by a selected deposition method of molecular beam epitaxy, chemical vapor deposition, atomic layer deposition, physical vapor deposition, and electrochemical vapor deposition.

12. The structure for implementing decoupling capacitors with hot spot thermal reduction as recited in claim 1 wherein said thermal connection material is a selected one of tungsten, aluminum, copper, titanium and nickel.

* * * * *